United States Patent
Dosaka (10) Patent No.: US 7,197,099 B2
(45) Date of Patent: Mar. 27, 2007

(54) DELAY CIRCUIT WITH TIMING ADJUSTMENT FUNCTION

(75) Inventor: Katsumi Dosaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 720 days.

(21) Appl. No.: 10/463,537

(22) Filed: Jun. 18, 2003

(65) Prior Publication Data

US 2005/0175135 A1     Aug. 11, 2005

(30) Foreign Application Priority Data

Dec. 26, 2002    (JP)    ............................. 2002-376705

(51) Int. Cl.
*H04L 25/40*    (2006.01)

(52) U.S. Cl. ...................... 375/371; 375/376; 327/149; 327/158; 327/161

(58) Field of Classification Search ................ 376/371, 376/373, 374–376; 327/144, 146, 147–150, 327/153, 155–159, 161, 162
See application file for complete search history.

(56) References Cited

U.S. PATENT DOCUMENTS 6,166,572 A  * 12/2000  Yamaoka ................... 327/149
6,389,090 B2 *  5/2002  Zortea et al. ................ 375/374
6,888,386 B2 *  5/2005  Peng .......................... 327/157
7,057,435 B2 *  6/2006  Mahanavelu et al. ....... 327/261

FOREIGN PATENT DOCUMENTS

| JP | 8-18414 | 1/1996 |
| JP | 9-8617 | 1/1997 |
| JP | 11-274904 | 10/1999 |
| JP | 2000-31818 | 1/2000 |
| JP | 2000-341099 | 12/2000 |
| JP | 2000-357951 | 12/2000 |

* cited by examiner

*Primary Examiner*—Dac V. Ha
(74) *Attorney, Agent, or Firm*—McDermott Will & Emery LLP (57) ABSTRACT

In a phase locked loop circuit, a phase comparator compares the phase of input clock and that of output clock, and provides a control signal as the comparison result. A charge pump circuit includes a clamp circuit, and based on the control signal, provides a control voltage of which lower limit is the reference voltage level. A voltage controlled oscillator receives the control voltage and a second control voltage from the outside and generates output clock having a frequency in accordance with the control voltages. Each delay stage of a delay section is configured with a plurality of delay units identical to that in the voltage controlled oscillator. The delay stage controls the delay time in response to the supply of the control voltage and the second control voltage.

5 Claims, 5 Drawing Sheets

DELAY CIRCUIT WITH TIMING ADJUSTMENT FUNCTION

BACKGROUND OF THE INVENTION

1. Field of the Invention

The present invention relates to a delay circuit delaying an input signal, and specifically, to a delay circuit with a timing adjustment function.

2. Description of the Background Art

A general configuration of a delay circuit delaying an input signal is to employ a plurality of delay elements connected in series. For example, an inverter formed of a P-channel MOS transistor and an N-channel MOS transistor connected in series is generally used as a delay element in a semiconductor device of CMOS (Complementary Metal-Oxide Semiconductor device) structure. An input signal can be delayed for a desired delay time by selecting the number of stages of the delay elements in the delay circuit.

On the other hand, it is difficult to render the characteristics of the elements forming the delay element uniform due to variations in a manufacturing process or fluctuations in the supply voltage or the ambient temperature, and thus, an accurate delay of input signal is undesirably hindered. For example, when the above-mentioned delay circuit is used for adjusting the timing of each signal in a signal read/write control circuit of DRAM (Dynamic Random-Access Memory), which is based on a row address strobe (RAS) access that uses RAS, the timing of RAS access changes as the set delay time changes, which in turn results in the degradation of the sensitivity.

In view of the foregoing, various delay circuits that can delay an input signal accurately have been proposed recently. Such delay circuits are disclosed, for example, in Japanese Patent Laying-Open No. 11-274904, Japanese Patent Laying-Open No. 2000-31818, Japanese Patent Laying-Open No. 2000-341099, and Japanese Patent Laying-Open No. 2000-357951.

As one example, a delay circuit formed of a delay section formed of a plurality of delay elements and a phase locked loop (PLL) circuit can be found.

The PLL circuit herein is a circuit for generating a clock synchronized for cooperatively operating a plurality of internal circuits mounted on the same system. The PLL circuit mainly includes a phase comparator comparing the phase of an input clock and that of a feed back clock being fed back from an internal circuit, a charge pump circuit providing a control signal based on the comparison result of the phase comparator, and a voltage controlled oscillator (VCO) supplying to the internal circuit an output signal having a frequency corresponding to the control signal.

The voltage controlled oscillator has a ring oscillator formed of the odd numbers of delay elements coupled in a ring form, and determines the operating current of each delay element in accordance with a control circuit. As a result, a clock with an oscillation frequency corresponding to the operating current of the delay element is output from the ring oscillator.

In the delay circuit in the configuration above, the voltage controlled oscillator, in response to a control signal from the charge pump circuit, changes an oscillation frequency fosc, i.e., the frequency of the output clock, and feeds back the output clock to the phase comparator. This series of operations is performed until the phase of the output clock and that of the feedback clock are coincident with each other. When the PLL circuit enters a so-called locked state, i.e., when the phase of the output clock and that of the feedback clock are coincident, the control signal takes on a certain fixed value, and the delay amount of each delay element in the voltage controlled oscillator is fixed to a prescribed value.

The delay section is configured with the same delay element as the voltage controlled oscillator, and controls the delay time in response to the charge pump circuit supplying the control signal to delay a data signal provided to the delay section. When the PLL circuit enters a locked state, each delay element receives a fixed control signal and thus the delay amount thereof is fixed to the same delay amount as in the voltage controlled oscillator.

Accordingly, since the delay amount of the delay section can be set with the accuracy ensured by the PLL circuit, it is possible to perform a timing adjustment without being affected by the variations in operating environment such as the supply voltage and the temperature as well as variations in processing.

In such a delay circuit, the PLL circuit has an output frequency range that can maintain the locked state (hereinafter also referred to as a lock range), and the delay time in the delay unit is also determined by this lock range. Note that the lock range of the PLL circuit largely depends on the output frequency range of the voltage controlled oscillator therein.

The oscillation frequency fosc of the voltage controlled oscillator changes in the locked state relative to the voltage level of the control signal being input. The control signal is generated based on the result of phase comparison performed by the phase comparator, and its voltage ranges from the ground voltage level to the vicinity of the ground voltage level.

In order to keep a wide lock range, the PLL circuit must be able to maintain the locked state in a wide control voltage range. Practically, however, when the control signal approaches close to the ground voltage level or the supply voltage level, jitter (phase shift) occurs in the generated clock due to the effect of noise superimposed on the supply voltage and the like, and thus the locked state can not be maintained. Accordingly, with a conventional delay circuit, it has been difficult to perform the timing adjustment stably.

SUMMARY OF THE INVENTION

The object of the present invention is to provide a delay circuit enabling a stable timing adjustment with high accuracy.

The delay circuit according to the present invention includes a clock generator circuit and a delay section. The clock generator circuit includes a variable delay circuit delaying input clock and generating output clock to be supplied to an internal circuit, a phase comparator performing a phase comparison between the input clock and the output clock, and a delay control circuit for outputting a control voltage for adjusting a delay amount of the variable delay circuit in response to a result of the phase comparison of the phase comparator. The delay section delays an input signal for a prescribed period in accordance with the control voltage of the delay control circuit and for outputting the delayed input signal. The variable delay circuit and the delay section each include a plurality of delay units formed of identical circuit elements, a unit delay amount of each of the delay units changing in accordance with the control voltage. The delay control circuit includes a clamp circuit for fixing lower limit of the control voltage to a reference voltage.

As described above, the delay section is configured with the same delay unit as the delay unit forming the voltage controlled oscillator of the phase locked loop circuit to adjust the delay amount of the delay units by the control voltage of the phase locked loop circuit and the second controlled voltage, whereby the timing adjustment is performed with high accuracy without being affected by variation in manufacturing process or fluctuations in the outside environment.

Further, by employing the configuration fixing the lower limit of the control voltage to a reference voltage, the timing adjustment is performed stably within the output frequency range of the phase locked loop circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, preferred embodiments of the present invention will be described in detail, referring to the drawings, in which the identical reference character indicates the identical or corresponding parts.

First Embodiment

Figure 1:
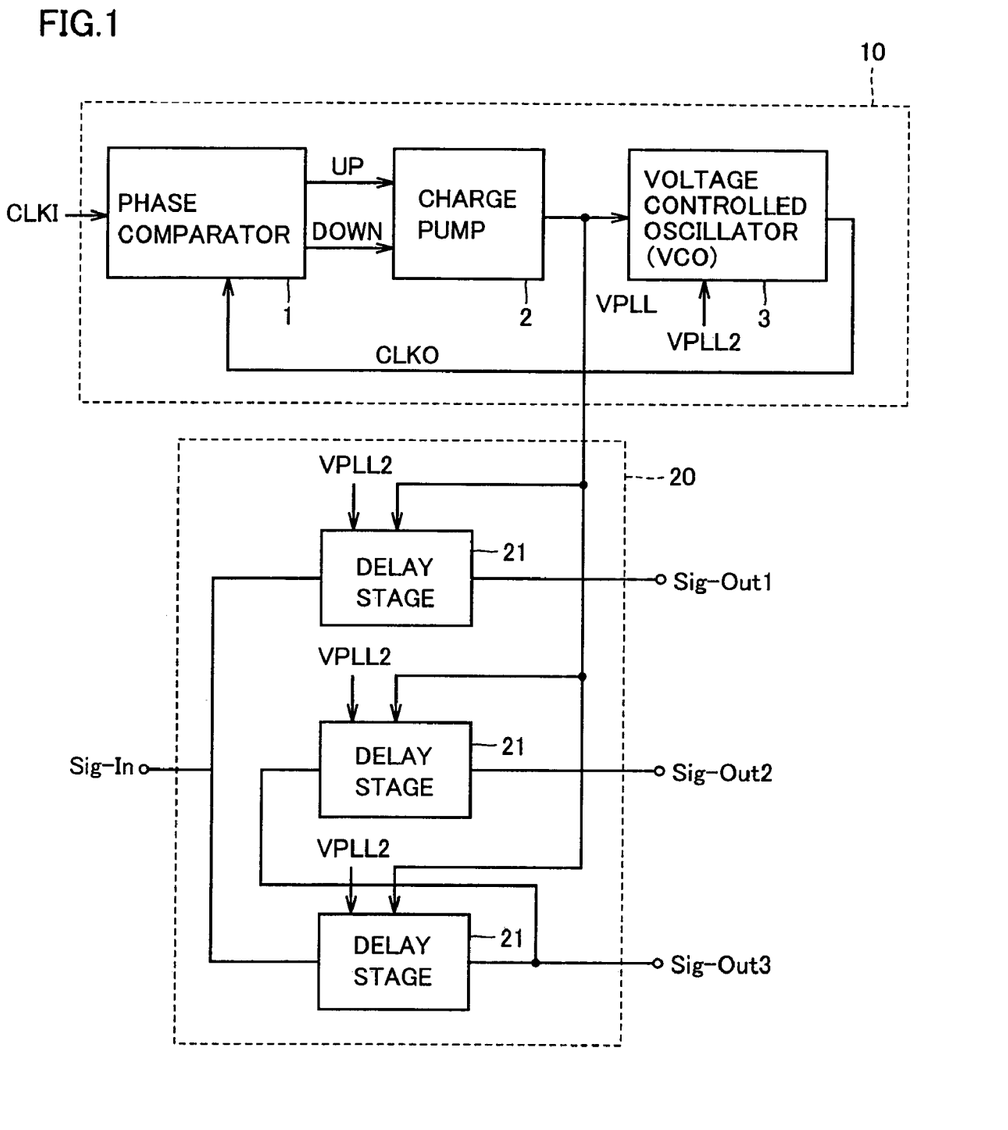
FIG. 1 is a schematic block diagram showing a configuration of a delay circuit according to the first embodiment of the present invention.

FIG. 1 is a schematic block diagram showing a configuration of a delay circuit according to a first embodiment of the present invention.

Referring to FIG. 1, the delay circuit includes a phase locked loop circuit 10 as a clock generating circuit for synchronizing an output clock CLKO with an input clock CLKI to output a control voltage VPLL of voltage controlled oscillator (VCO), and a delay section 20 of which delay time is controlled in response to the supply of control voltage VPLL.

Phase lock loop circuit 10 includes a phase comparator 1 comparing the phase of input clock CLKI and that of output clock CLKO, a charge pump circuit 2 providing control voltage VPLL in accordance with the result of phase comparison performed by phase comparator 1, and voltage controlled oscillator 3 generating output clock CLKO having the oscillation frequency in accordance with control voltage VPLL.

Further, output clock CLKO is supplied to an internal circuit (not shown) as operating clock. Output clock CLKO can be fed back directly to phase comparator 1 as shown in FIG. 1, or can be fed back via a drive circuit of the internal circuit (not shown).

Phase comparator 1, of which detailed circuit configuration is not illustrated, compares the phase of input clock CLKI and that of output clock CLKO, and based on the comparison result, generates control signals UP, DOWN. Specifically, when the phase of output clock CLKO lags behind input clock CLKI, control signal UP of H (logic high) level is generated. When the phase of output clock CLKO is ahead of input clock CLKI, control signal DOWN of H level is generated. Note that, control signals UP, DOWN are the signals transiting between two potential states of high potential and low potential, where the high potential state corresponds to H level and the low potential state corresponds to L (logic low) level.

In response to the reception of control signals UP, DOWN, charge pump circuit 2 performs a charge pump operation in accordance with the potential of the control signals, and outputs control voltage VPLL of voltage controlled oscillator 3 in the subsequent stage. The detailed description of its specific configuration will be given later.

A delay section 20 is configured with a plurality of delay stages 21, each delay an input signal Sig-In for a prescribed period and output respective signals Sig-Out1 . . . Sig-Out3. Though delay section 20 shown in FIG. 1 is configured with three delay stages 21, the number of the delay stages in the configuration is not limited to this number, and can be set arbitrary in accordance with the number of output signals.

In the configuration as above, control voltage VPLL output from charge pump circuit 2 is provided to voltage controlled oscillator 3 in phase locked loop circuit 10, and to delay stages 21 in delay section 20. Note that, delay stage 21 and voltage controlled oscillator 3 are formed with a plurality of the identical delay units connected in series.

Each delay unit included in delay stage 21 and voltage controlled oscillator 3 receives control voltage VPLL from charge pump circuit 2 as well as a second control voltage VPLL2 from the outside of the delay circuit. Each delay unit adjusts, as will be described in detail later, the delay amount in accordance with these control voltages VPLL, VPLL2.

In phase locked loop circuit 10, voltage controlled oscillator 3 further provides output clock CLKO having oscillation frequency fosc determined by the delay amount of each delay unit. Phase locked loop circuit 10 continues the series of operation until it enters a locked state, i.e., until the phase of output clock CLKO and that of input clock CLKI becomes coincident with each other. Since control voltage VPLL takes on a fixed value when phase locked loop circuit 10 enters the locked state, the delay amount of each delay unit is fixed to a prescribed value.

Figure 2:
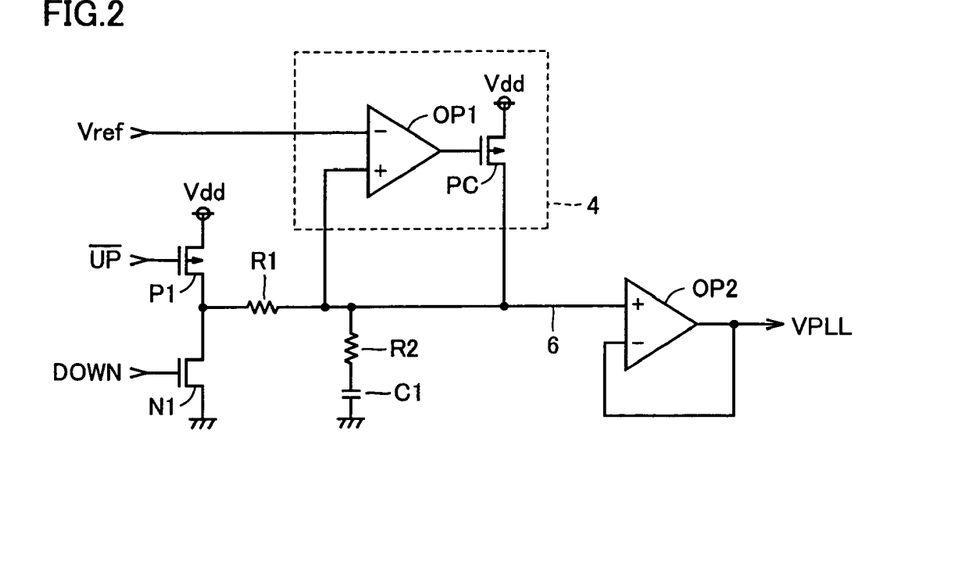
FIG. 2 shows one example of a configuration of the charge pump circuit shown in FIG. 1.

FIG. 2 shows one example of the configuration of charge pump circuit 2 in phase locked loop circuit 10 shown in FIG. 1.

Referring to FIG. 2, charge pump circuit 2 includes a P-channel MOS transistor P1 and an N-channel MOS transistor N1 connected in series between an external power supply node Vdd and the ground potential, a filter circuit formed of resistor elements R1, R2 and a capacitor C1, and operational amplifier OP2.

A connection node between P-channel MOS transistor P1 and N-channel MOS transistor N1 is coupled to control voltage line 6 supplying control voltage VPLL. P-channel MOS transistor P1 and N-channel MOS transistor N1 receive control signals UP, DOWN from phase cooperator 1 shown in FIG. 1 at their gates, respectively, and in response to the voltage level thereof, drive the potential of control voltage line 6. Note that control signal UP is input to P-channel MOS transistor P1 with inverted logic level.

Therefore, when control signal UP is at H level, i.e., when the phase of output clock CLKO is ahead of the phase of input clock CLKI, P-channel MOS transistor P1 turns on to drive the potential of control voltage line 6 to H level. When control signal DOWN is at H level, i.e., when the phase of output clock CLKO is behind the phase of input clock CLKI, N-channel MOS transistor N1 turns on to drive the potential of control voltage line 6 to L level.

To control voltage line 6, the filter circuit is further coupled. The filter circuit has, as shown in FIG. 2, resistor element R1 serially coupled to control voltage line 6, resistor element R2 and capacitor C1 coupled between control voltage line 6 and the ground potential. When the resistance value of resistor elements R1, R2 and capacitance value of capacitor C1 are expressed as R1, R2 and C1, respectively, and the combined resistance value of resistor elements R1, R2 is expressed as R, the cutoff frequency of the filter circuit will be expressed as follows: $fc=1/(2\pi \cdot R \cdot C)$ (where $R=R1+R2$). Since the filter circuit removes the high frequency components, i.e., noises, of control voltage VPLL, it is provided for stabilizing oscillation frequency fosc of voltage controlled oscillator 3.

To the output node of the filter circuit, operational amplifier OP2 serially coupled to control voltage line 6 is arranged. The output terminal of operational amplifier OP2 is directly coupled to the inverting input terminal. The non-inverting terminal of operational amplifier OP2 is connected to control voltage line 6 and receives the voltage smoothed by the filter circuit. Thus, operational amplifier OP2 operates as a so-called voltage follower circuit. Since operating amplifier OP2 ideally has infinite input impedance and zero output impedance, it can generate control voltage VPLL of the same level as the smoothed voltage, without being affected by preceding and subsequent circuit groups.

In the delay circuit according to the present embodiment, charge pump circuit 2 included in phase locked loop circuit 10 further includes, as shown in FIG. 2, a clamp circuit 4 coupled to control voltage line 6.

Clamp circuit 4 has an operational amplifier OP1, and a P-channel MOS transistor PC coupled to the output terminal of operational amplifier OP1. Operational amplifier OP1 receives reference voltage Vref at is inverting input terminal, and receives the drive voltage of control voltage line 6 at its non-inverting input terminal. P-channel MOS transistor PC is electrically coupled between external power supply node Vdd and control voltage line 6, and has its gate coupled to the output terminal of operational amplifier OP1.

In this configuration, operational amplifier OP1 operates as a comparator comparing reference voltage Vref and the driving voltage of control voltage line 6. When the driving voltage begins to drop from reference voltage Vref, the gate voltage of P-channel MOS transistor PC drops and turns on, and starts charging control voltage line 6. Then, when the voltage level of control voltage line 6 begins to rise higher than reference voltage Vref, the gate voltage of P-channel MOS transistor PC rises and turns off, and stops the charging. Through such an operation, the voltage level of control voltage line 6 is constantly kept at reference voltage Vref or above.

Accordingly, control voltage VPLL output from charge pump circuit 2 provided with clamp circuit 4 constantly maintains the potential at reference voltage Vref or above. Note that, by setting reference voltage Vref to the potential level of control voltage VPLL generating output clock CLKO, which has the frequency to be the lower limit of the lock range of phase locked loop circuit 10, voltage controlled oscillator 3 of the subsequent stage can generate output clock CLKO stably, without deviating from the output frequency range.

Further, phase locked loop circuit 10 requires a prescribed period in a transient phenomenon from the unlocked state, such as at power-on, to the state locked by an input signal (hereinafter also referred to as a lock-in time). The lock-in time varies depending on the initial state of control voltage VPLL also, provided that the loop gain is constant.

Note that, when the charge pump circuit is configured without the clamp circuit, control voltage VPLL output at power-on will be at undefined potential in the voltage range from ground potential to the vicinity of supply voltage. Accordingly, if the initial value of control voltage VPLL takes the upper limit or the lower limit of the voltage range, the phase locked loop circuit may require a long lock-in time.

In contrast thereto, in the charge pump circuit according to the present embodiment, since control voltage VPLL is determined to the potential in the vicinity of supply voltage Vref even at power-on, the lock-in time can further be reduced.

Note that, the present configuration is capable of reducing the recovery time even when the locked state is temporarily lost. From the foregoing, the delay circuit according to the present embodiment can perform timing adjustment stably and at high accuracy.

Figure 3:
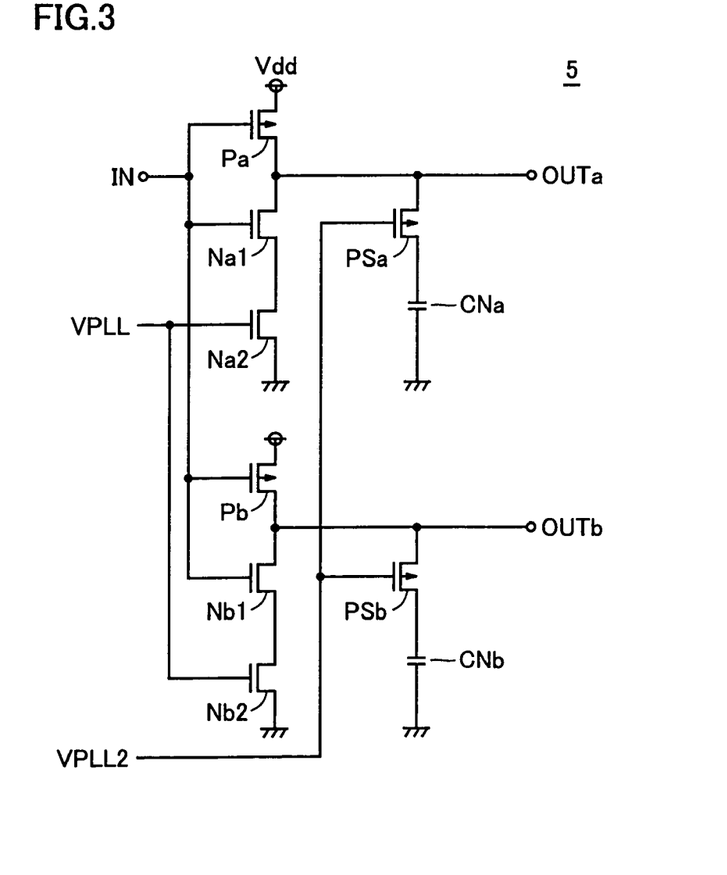
FIG. 3 shows one example of a configuration of a delay unit forming the voltage controlled oscillator and the delay unit shown in FIG. 1.

FIG. 3 shows one example of the delay unit used for voltage controlled oscillator 3 and delay stage 21 included in delay section shown in FIG. 1. Voltage controlled oscillator 3 and delay stage 21 are configured, as will be described in detail later, with a plurality stages of delay units 5 shown in FIG. 3 connected in series.

Referring to FIG. 3, delay unit 5 includes an inverter formed with a P-channel MOS transistor Pa and an N-channel MOS transistor Na1, and an inverter formed with a P-channel MOS transistor Pb and an N-channel MOS transistor Nb1.

The inverters are connected in parallel relative to input node IN, and when receiving a transmission signal from delay unit 5 of a preceding stage (not shown), provides a signal delayed for a prescribed delay amount determined by control voltage VPLL, VPLL2 to output nodes OUTa, OUTb, respectively.

Output node OUTa is coupled to input node IN of delay unit 5 of a subsequent stage (not shown), and the delay signal is transmitted to the subsequent stage. Output node OUTb, as in delay stage 21 shown in FIG. 1, is the node for outputting a delay signal, and a signal delayed for a desired delay amount is thus provided to the outside of delay stage 21. Note that, in delay unit 5 forming voltage controlled oscillator 3 shown in FIG. 1, output node OUTb for outputting a delay signal may be unnecessary and thus can be omitted.

In the present embodiment, delay unit 5 is configured with two inverters connected in parallel, with one inverter allocated for signal transmission for delay unit 5 of the subsequent stage, while the other inverter allocated for outputting a delay signal to the outside. By employing such a configuration, the fan-out in each delay unit will constantly be two, which suppress the shift of the delay amount between delay units.

Further, between each source of N-channel MOS transistors Na1, Nb 1 of the inverters and the ground potential, N-channel MOS transistors Na2, Nb2 are coupled, respectively. N-channel MOS transistors Na2, Nb2 receive control voltage VPLL at their gates and drive to on/off state in accordance with the potential level thereof.

N-channel MOS transistor Na2, Nb2 operate as delay amount adjusting transistors in the inverters respectively, since the change of channel resistance in accordance with the potential of control voltage VPLL increases/decreases the delay amount of delay unit 5.

Specifically, when control voltage VPLL is at H level (when the phase of output clock CLKO lags behind), N-channel MOS transistors Na2, Nb2 are driven to on-state. Accordingly, the channel resistance decreases, and the fall time of a signal provided from the output node of each inverter becomes shorter. Hence, the delay amount is reduced.

When control voltage VPLL is at L level (when the phase of output clock CLKO is leading), N-channel MOS transistors Na2, Nb2 are driven to off-state. Accordingly, the channel resistance increases and the fall time of a signal provided from the output node of each inverter becomes longer. Hence, the delay amount is increased.

Figure 5:
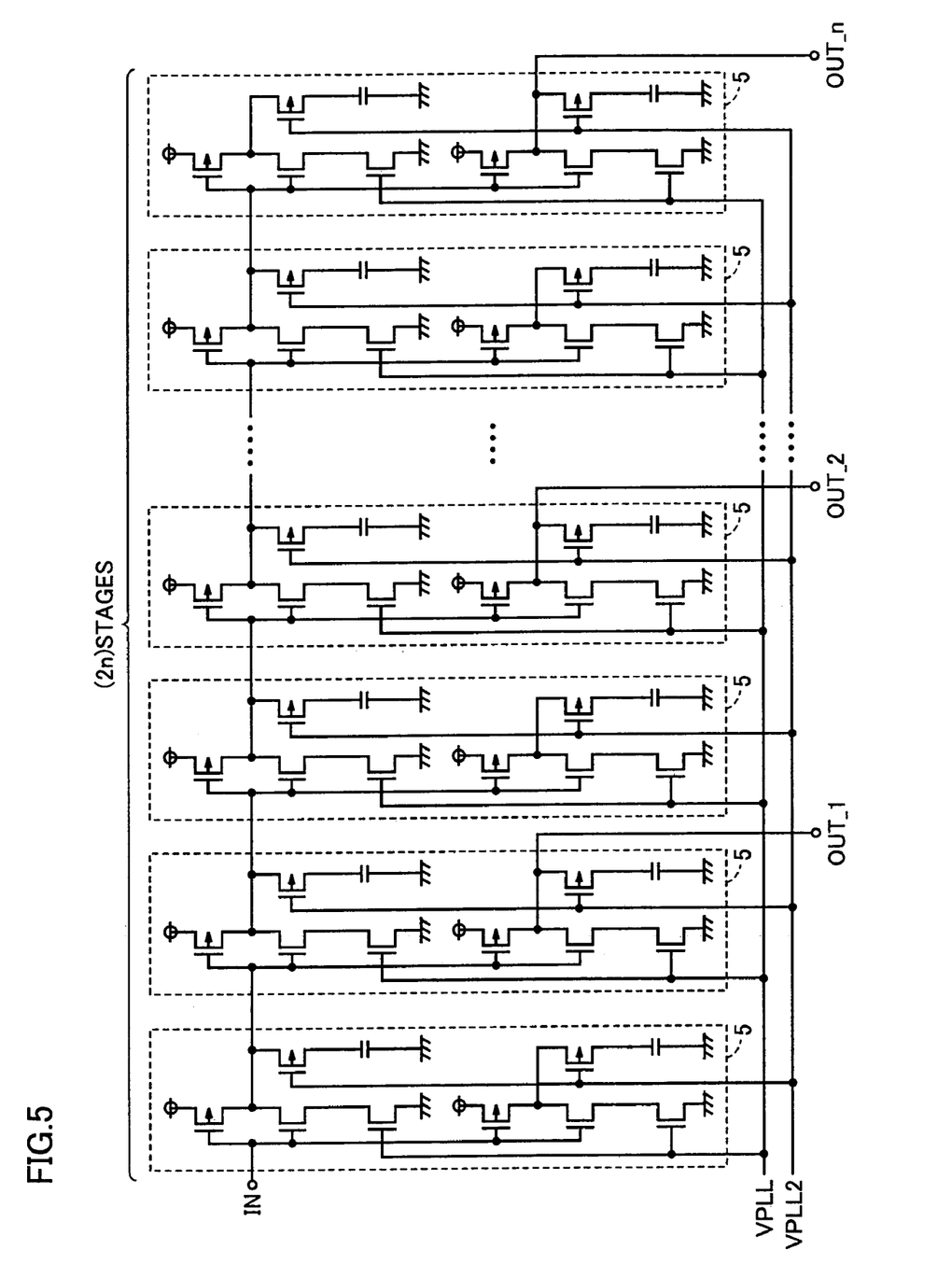
FIG. 5 shows one example of a configuration of a delay stage in the delay section shown in FIG. 1.

In delay unit 5 shown in FIG. 5, capacitors CNa, CNb are coupled between the output node of each inverter and the ground voltage, respectively, as means for adjusting delay amount. Between capacitors CNa, CNb and the output node of the inverters, P-channel MOS transistors PSa, PSb as switching transistors are electrically coupled, respectively.

P-channel MOS transistors PSa, PSb receive a second control voltage VPLL2 at their gates, and in accordance with the potential level thereof, connect/disconnect the output nodes of the inverters and capacitors CNa, CNb.

Note that, the second control voltage VPLL2 is a variable voltage having a voltage range from the ground voltage level to the supply voltage level, and being input from the outside of the delay circuit. Regarding the input manner of the second control voltage VPLL2, though not shown in the figure, one possible configuration includes a plurality of apply terminals of second control voltage VPLL2 set at several potential levels, with a fuse element arranged between each apply terminal and respective gate of P-channel MOS transistors PSa, PSb. An adjustment is made in a manufacturing process by a laser programming so that a desired voltage is applied to respective gate of P-channel MOS transistors PSa, PSb. By employing such a configuration, the delay circuit of the present invention can withstand the variations in a manufacturing process than a conventional delay circuit ensured by a single control voltage VPLL.

P-channel MOS transistors PSa, PSb both turn on when the second control voltage VPLL2 is at the ground voltage level, and electrically couple the output nodes of the inverters and capacitors CNa, CNb, respectively. Accordingly, the load capacitance is present on a signal line, resulting in a large delay amount.

P-channel MOS transistors PSa, PSb both turn off when the second control voltage VPLL2 is at the supply voltage level, and electrically disconnect the output nodes of the inverters and capacitors CNa, CNb, respectively. Accordingly, the load capacitance is not present on a signal line, resulting in a small delay amount.

Further, when the potential of the second control voltage VPLL2 is set to a control voltage VPLL level that takes on the intermediate value between the ground potential and the supply voltage, since the signal line is coupled with a load formed of the channel resistance of P-channel MOS transistors PSa, PSb and capacitors CNa, CNb, the delay amount is adjusted to the intermediate value between the above mentioned two values.

As above, the delay amount of delay unit 5 is adjusted by controlling the potential level of control voltages VPLL, VPLL2, in accordance with the phase difference between input clock CLKI and output clock CLKO. Specifically, since the delay amount of each delay unit 5 decreases when the phase of output clock CLKO lags behind, the cycle of output clock CLKO being output becomes shorter. Since the delay amount of each delay unit 5 increases when the phase of output clock CLKO is leading, the cycle of output clock CLKO being output becomes longer. Then, when the phase of output clock CLKO is coincident with that of input clock CLKI, phase locked loop circuit 10 enters the locked state and the cycle of output clock CLKO and that of input clock CLKI will become the same.

Figure 4:
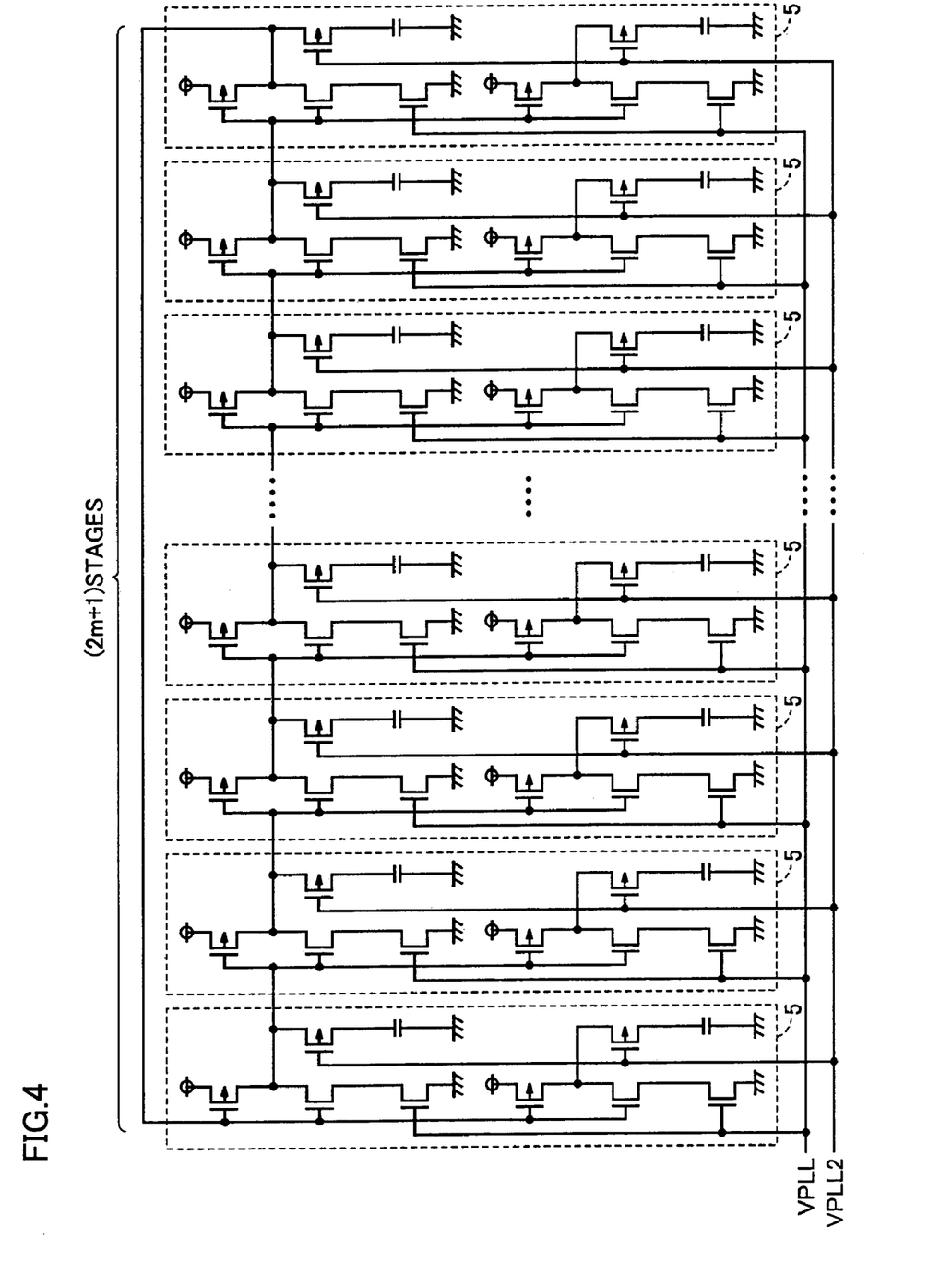
FIG. 4 shows one example of a configuration of a charge pump circuit in the phase locked loop circuit shown in FIG. 1.

FIG. 4 shows one example of the configuration of voltage controlled oscillator 3 shown in FIG. 1.

Referring to FIG. 4, voltage controlled oscillator 3 is formed of a ring oscillator where odd numbers (2m+1: where m is a natural number) of delay units 5 are coupled in a ring form.

Each delay unit 5 of voltage controlled oscillator 3 receives control voltage VPLL that is an output signal from charge pump circuit 2, and the second control voltage VPLL2 adjusted to the desired voltage level in a manufacturing process. The delay amount of each delay unit 5 is controlled in accordance with these control voltages.

When the phases of output clock CLKO and input clock CLKI are coincident with each other and phase locked loop circuit 10 enters the locked state, control voltage VPLL takes on a fixed value and the delay amount of each delay unit 5 is fixed to a prescribed value. For example, assuming that the frequency of input clock CLKI is fin (i.e., the pulse cycle is 1/fin), the delay amount in each delay unit of (2m+1) delay stages will be (1/fin)/(2m+1).

FIG. 5 shows one example of the configuration of delay stage 21 in FIG. 1.

Referring to FIG. 5, delay stage 21 is configured with serially-connected even numbers (2n: where n is a natural number) of delay units 5 shown in FIG. 3, and its basic configuration is the same as voltage controlled oscillator 3 shown in FIG. 4.

Accordingly, each delay unit 5 forming delay stage 21 receives, similarly to voltage controlled oscillator 3 in FIG. 4, control voltage VPLL output from charge pump circuit 2 and the second control voltage VPLL2 adjusted to a desired voltage level, and thus the delay amount is adjusted. When phase locked loop circuit 10 enters the locked state, the delay amount of each delay unit 5 of delay stage 21 is fixed to a prescribed value, receiving control voltage VPLL set at a fixed value. At this time, since each delay unit 5 is in the same configuration as delay unit 5 of voltage controlled oscillator 3 shown in FIG. 4, the delay amount thereof will also be equal to each other. Specifically, according to the above example where the frequency of input clock CLKI is fin (i.e., the pulse cycle is 1/fin), the delay amount of each delay unit 5 in delay stage 21 will be (1/fin)/(2m+1).

As above, by forming voltage controlled oscillator 3 in phase locked loop circuit 10 and delay stage 21 in delay section 20 with the same delay units 5, the delay time of delay section 20 can be controlled to take on a constant value determined by the frequency of input clock CLKI, without being affected by the change of the outside environment such as the temperature and the supply voltage. Therefore, output signals Sig-Out1 Sig-Out3 will become delay signals with each delay amount set with high accuracy.

Referring back to FIG. 5, each delay unit 5 includes two output nodes OUTa, OUTb, as shown in FIG. 3. Output nodes OUTb, for outputting to the outside, of delay unit 5 in even stages are coupled to output nodes OUT_1 . . . OUT_n of delay stage 21, respectively. Therefore, a delay signal with the phase coincident with an input signal can be output from each output node OUT_1 . . . OUT_n. For example, a signal provided from output node OUT_1 is the signal provided to input node IN and delayed for the delay time expressed as 2·(1/fin)/(2m+1). Specifically, the minimum step of the change in delay time provided to an input signal at delay section 20 corresponds to the delay amount of two stages of delay units.

Further, one output node OUT_i (where i is a natural number equal to or smaller than n) is selected from output nodes OUT_1 . . . OUT_n of delay stage 21 to provide an output signal.

As a result, in delay section 20 shown in FIG. 1, as input signal Sig-In is input to input node IN of each delay stage 21, output signals Sig-Out1 . . . Sig-Out3 delayed for respective desired delay amount will be provided in-phase.

As above, according to the first embodiment of the present invention, since the delay section is formed with the same delay units as that in phase locked loop circuit and the delay amount of the delay unit is controlled by the control voltage of the phase locked loop circuit and the second control voltage, the delay time in the delay section can be controlled with high accuracy, without being affected by the manufacturing variations and the changes in the external environment.

Further, since the control voltage generated by the phase locked loop circuit is constantly maintained at the reference voltage or above, the timing adjustment cam be performed stably without deviating from the lock range of the phase locked loop circuit.

Second Embodiment

Figure 6:
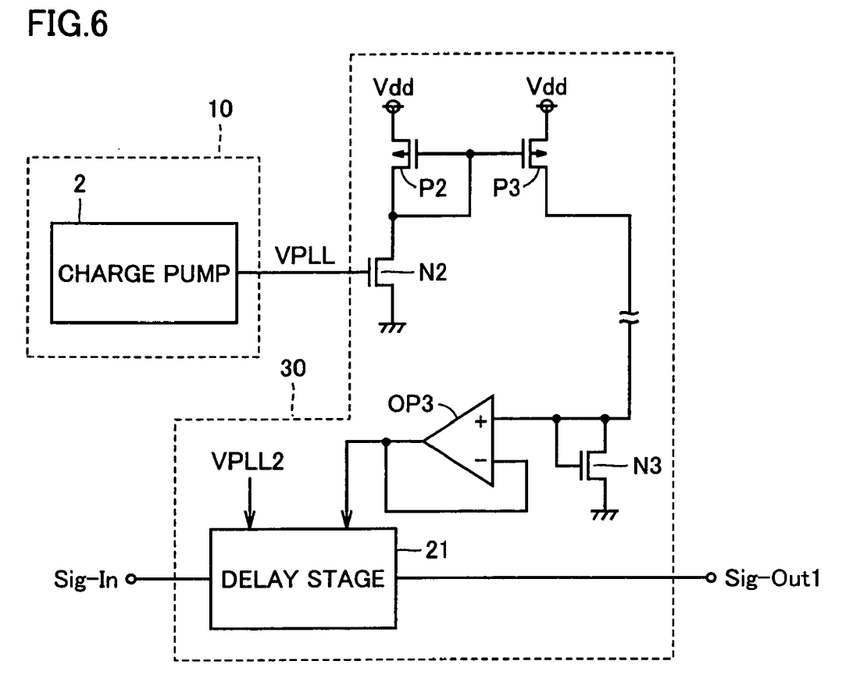
FIG. 6 is a schematic block diagram showing a configuration of the delay circuit according to the second embodiment of the present invention.

FIG. 6 shows a schematic block diagram of the configuration of a delay circuit according to a second embodiment of the present invention.

Referring to FIG. 6, the delay circuit is formed of phase locked loop circuit 10 and a delay section 30. As for phase locked loop circuit 10, since its configuration is similar to that of the delay circuit in the first embodiment shown in FIG. 1, only charge pump circuit 2 is illustrated and the detailed description will not be repeated.

Delay section 30 includes, as in the first embodiment, a plurality of delay stages 21. In FIG. 6, for simplifying the illustration, only one delay stage is illustrated and the rest of the delay stages are not shown. Delay stage 21 changes the delay time in accordance with a control signal based on control voltage VPLL of charge pump circuit 2, as in the first embodiment.

Delay section 30 further includes P-channel MOS transistors P2, P3, N-channel MOS transistors N2, N3, and an operational amplifier OP3, arranged between the output node of charge pump circuit 2 and the control voltage input node of delay stage 21. The delay circuit of the present embodiment is different from the first embodiment in this respect, which directly supplies control voltage VPLL.

P-channel MOS transistor P2 and N-channel MOS transistor N2 are coupled in series between external power supply node Vdd and the ground potential. The gate of N-channel MOS transistor N2 is connected to the output node of charge pump circuit 2 and receives control voltage VPLL.

P-channel MOS transistor P3 has its source connected to external power supply node Vdd, and its gate connected to the gate and the drain of P-channel MOS transistor P2, thus forming a current mirror with P-channel MOS transistor P2.

Assuming that P-channel MOS transistors P2 and P3 are of the same size, P-channel MOS transistor P3 passes a mirror current equal to the current passing through P-channel MOS transistor P2.

N-channel MOS transistor N3 is electrically coupled between the drain of P-channel MOS transistor P3 and the ground voltage, with the gate of N-channel MOS transistor N3 connected to the drain of P-channel MOS transistor P3.

Operational amplifier OP3 has its non-inverting input terminal connected to the gate and the drain of N-channel MOS transistor N3, with inverting input terminal directly coupled to the output terminal of operational amplifier OP3. Accordingly, operational amplifier OP3 operates as a voltage follower circuit. Since operational amplifier OP3 ideally has infinite input impedance and zero output impedance, it can generate a voltage at the same level as an input voltage without being affected by the circuit groups connected at preceding and subsequent stages. Further, the output terminal of operational amplifier OP3 is coupled to the control voltage input node of delay stage 21.

In the configuration above, as N-channel MOS transistor N2 receives control voltage VPLL from charge pump circuit 2 at its gate, it is driven in accordance with the potential level of control voltage VPLL, and passes current between its drain and source. P-channel MOS transistor P2 is driven as well to pass the current, which passes through N-channel MOS transistor N2, between its source and drain.

Since P-channel MOS transistor P3 forms a current mirror with P-channel MOS transistor P2, it passes a current equivalent to that passing P-channel MOS transistor P2.

The current passing through P-channel MOS transistor P3 is transmitted to N-channel MOS transistor N3 and operational amplifier OP3. Note that, since the input impedance of operational amplifier OP3 is very large, the entirety of thus transmitted current flows into N-channel MOS transistor N3. As a result, N-channel MOS transistor N3 passes the current equivalent to that passing N-channel MOS transistor N2. Specifically, the potential of the gate of N-channel MOS transistor N3 is equal to that of N-channel MOS transistor N2, and its potential level is driven to control voltage VPLL and input to operational amplifier OP3.

Further, since operational amplifier OP3 forms a voltage follower, the voltage equal to an input voltage is driven to the output terminal to be supplied to the input node of control voltage VPLL of delay unit 5, shown in FIG. 3, as the control voltage of delay stage 21.

As a result, delay stage 21 is supplied with the control voltage at a potential equal to control voltage VPLL in phase locked loop circuit 10. Thus, each delay unit in delay stage 21 can control the delay amount at the accuracy ensured by phase locked loop circuit 10.

As above, the delay circuit according to the present embodiment employs the configuration in which control voltage VPLL from charge pump circuit 2 is converted into a current output in delay section 30 and then supplied to each delay stage 21. This is based on the following.

The delay circuit according to the present invention controls the delay amount by changing the channel resistance of the transistors included in delay unit 5 in accordance with the potential difference between control voltage VPLL, which is input into voltage controlled oscillator 3 of phase locked loop circuit 10 as well as each delay stage 21 of delay section 30, and the ground potential. Accordingly, it is assumed that the ground potential level is matched between voltage controlled oscillator 3 and delay stage 21. On the other hand, since the ground potential level fluctuates depending on the structure of the line from the ground potential supply node, it is required to arrange voltage controlled oscillator 3 and delay stage 21 in close proximate to each other. As a result, the degree of freedom in the circuit layout is restricted.

Therefore, as shown in FIG. 6, the present embodiment employs the configuration in which control voltage VPLL from charge pump circuit 2 is converted into a current output and transmitted through delay section 30, and thereafter reconverted to a voltage and supplied to each delay stage 21 as a control voltage. Thus, the potential difference between the voltage recovered from the transmitted current and the ground potential can be matched to the potential difference between control voltage VPLL in phase locked loop circuit 10 and the ground potential. Therefore, since voltage controlled oscillator 3 and delay stage 21 are supplied with a control voltage of equal potential irrespective of their relationship in arrangement, the timing adjustment function with high accuracy can be maintained, while improving the degree of freedom in the circuit layout.

Variation

Figure 7:
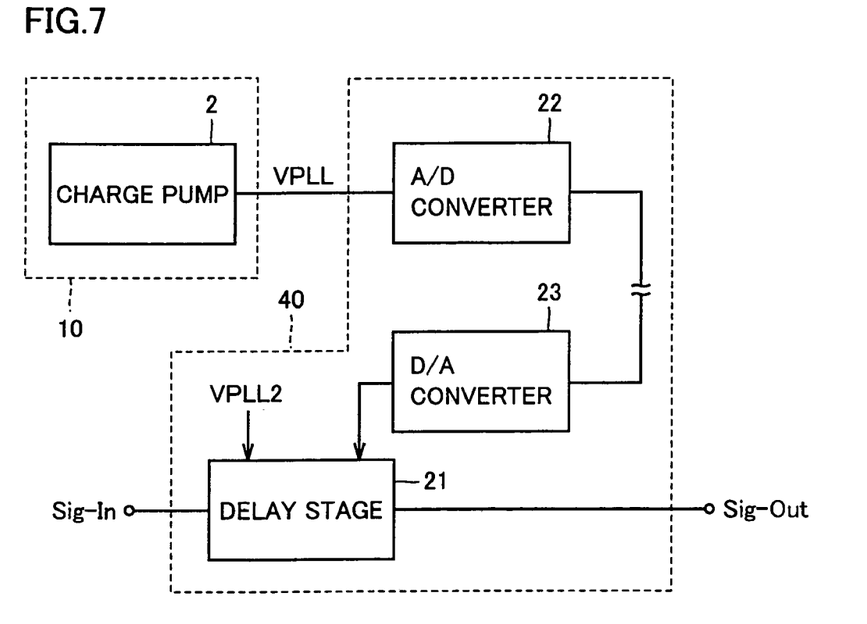
FIG. 7 is a schematic block diagram showing a configuration of the delay circuit according to a variation of the second embodiment of the present invention.

FIG. 7 is a schematic block diagram showing a configuration of a delay circuit according to a variation of the second embodiment of the present invention.

Referring to FIG. 7, the delay circuit is formed of phase locked loop circuit 10 and a delay section 40. Phase locked loop circuit 10 has a configuration similar to that of the delay circuit in the first embodiment shown in FIG. 1, thus only charge pump circuit 2 is illustrated and detailed description will not be repeated. Further, delay section 40 includes a plurality of delay stages 21 as in delay section 20 in the delay circuit according to the first embodiment shown in FIG. 1, for simplifying the illustration, only one delay stage is illustrated while the rest of the delay stages are not illustrated.

The delay circuit of the present variation further includes, as means for matching the level of the control voltage supplied to voltage controlled oscillator 3 and delay stage 21, an A/D converter circuit 22 and a D/A converter circuit 23 arranged within delay section 40.

A/D converter circuit 22 and D/A converter circuit 23 are coupled in series between the output node of charge pump circuit 2 and the control voltage input node of delay stage 21. A/D converter circuit 22 is arranged near charge pump circuit 2, while D/A converter circuit 23 is arranged near delay stage 21.

In this configuration, control voltage VPLL of an analog signal output from charge pump circuit 2 is converted into a digital signal by A/D converter circuit 22. The digital signal thus converted is transmitted to delay stage 21 inside delay section 40. Further, the digital signal is reconverted to a control voltage of an analog signal in the subsequent stage of D/A converter circuit 23, thereafter supplied to the input node of control voltage VPLL of each delay unit 5 as a control voltage of delay stage 21.

By converting control voltage VPLL of an analog signal into a digital signal before transmission, even when delay stage 21 is arranged at a distance, deterioration such as noise can be suppressed, and the original wave form of control voltage can be recovered in D/A converter circuit 23 of the subsequent stage. As a result, the control voltage supplied to voltage controlled oscillator 3 and delay stage 21 can be matched irrespective of their relationship of arrangement, the timing adjustment function with high accuracy can be maintained, while the freedom in the circuit layout can be improved.

Though in the first and second embodiments, the configurations where the phase locked loop circuit as a clock generator circuit is used and the control voltage thereof is utilizing to perform timing adjustment have been described, a configuration employing a DLL (Delay Locked Loop) circuit is also applicable to attain the similar function and effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay circuit comprising:
   a clock generator circuit; and
   a delay section;
   said clock generator circuit including
   a variable delay circuit delaying input clock and generating output clock to be supplied to an internal circuit,
   a phase comparator performing a phase comparison between said input clock and said output clock, and
   a delay control circuit outputting a control voltage for adjusting a delay amount of said variable delay circuit in response to a result of said phase comparison of said phase comparator;
   said delay section delaying an input signal for a prescribed period in accordance with said control voltage of said delay control circuit and for outputting the delayed input signal,
   said variable delay circuit and said delay section each including a plurality of delay units formed of identical circuit elements, a unit delay amount of each of said delay units changing in accordance with said control voltage, and
   said delay control circuit including a clamp circuit for fixing lower limit of said control voltage to a reference voltage, wherein
   said clamp circuit includes;
   a comparator for comparing said control voltage and said reference voltage; and
   a drive transistor for providing a current to an output node of said control voltage to drive said control voltage at least to said reference voltage in response to a comparison result signal from said comparator.

2. The delay circuit according to claim 1, wherein said reference voltage is set to a voltage level generating output clock having a frequency of lower limit of output frequency range in said variable delay circuit.

3. A delay circuit comprising:
   a clock generator circuit; and
   a delay section;
   said clock generator circuit including
   a variable delay circuit delaying input clock and generating output clock to be supplied to an internal circuit,
   a phase comparator performing a phase comparison between said input clock and said output clock, and
   a delay control circuit outputting a control voltage for adjusting a delay amount of said variable delay circuit in response to a result of said phase comparison of said phase comparator;
   said delay section delaying an input signal for a prescribed period in accordance with said control voltage of said delay control circuit and for outputting the delayed input signal,
   said variable delay circuit and said delay section each including a plurality of delay units formed of identical circuit elements, a unit delay amount of each of said delay units changing in accordance with said control voltage, and said delay control circuit including a clamp circuit for fixing lower limit of said control voltage to a reference voltage, wherein said variable delay circuit and said delay section control the delay amount of each of said delay units in response to said control voltage input from said delay control circuit and a second control voltage input from outside, each of said delay units includes two inverters connected in parallel and operating in accordance with said control voltage, and a switch and a capacitor connected in series between an output node of each of said inverters and ground potential, and said switch turns on/off in accordance with said second control voltage to electrically connect/disconnect said output node of said inverter and said capacitor.

4. A delay circuit comprising:

a clock generator circuit; and a delay section;

said clock generator circuit including a variable delay circuit delaying input clock and generating output clock to be supplied to an internal circuit, a phase comparator performing a phase comparison between said input clock and said output clock, and a delay control circuit outputting a control voltage for adjusting a delay amount of said variable delay circuit in response to a result of said phase comparison of said phase comparator;

said delay section delaying an input signal for a prescribed period in accordance with said control voltage of said delay control circuit and for outputting the delayed input signal, said variable delay circuit and said delay section each including a plurality of delay units formed of identical circuit elements, a unit delay amount of each of said delay units changing in accordance with said control voltage, and said delay control circuit including a clamp circuit for fixing lower limit of said control voltage to a reference voltage, wherein said delay section further includes a voltage current converter circuit for converting said control voltage from said variable delay circuit into a current, and a current voltage converter circuit for recovering a voltage with a same potential as said control voltage from the converted current and outputting the recovered voltage to each of said delay units.

5. A delay circuit comprising:

a clock generator circuit; and a delay section;

said clock generator circuit including a variable delay circuit delaying input clock and generating output clock to be supplied to an internal circuit, a phase comparator performing a phase comparison between said input clock and said output clock, and a delay control circuit outputting a control voltage for adjusting a delay amount of said variable delay circuit in response to a result of said phase comparison of said phase comparator;

said delay section delaying an input signal for a prescribed period in accordance with said control voltage of said delay control circuit and for outputting the delayed input signal, said variable delay circuit and said delay section each including a plurality of delay units formed of identical circuit elements, a unit delay amount of each of said delay units changing in accordance with said control voltage, and said delay control circuit including a clamp circuit for fixing lower limit of said control voltage to a reference voltage, wherein said delay section further includes an analog digital converter circuit for converting said control voltage from said variable delay circuit into a digital signal, and a digital analog converter circuit for recovering an analog signal with the same potential as said control voltage from the converted digital signal and for outputting the recovered analog signal to each of said delay units.

* * * * *